US008121169B2

(12) United States Patent
Nguyen et al.

(10) Patent No.: US 8,121,169 B2
(45) Date of Patent: Feb. 21, 2012

(54) SPLIT CONTROL OF FRONT AND REAR DBR GRATING PORTIONS

(75) Inventors: Hong Ky Nguyen, Painted Post, NY (US); Chung-En Zah, Holmdel, NJ (US)

(73) Assignee: Corning Incorporated, Corning, NY (US)

( * ) Notice: Subject to any disclaimer, the term of this patent is extended or adjusted under 35 U.S.C. 154(b) by 213 days.

(21) Appl. No.: 12/423,222

(22) Filed: Apr. 14, 2009

(65) Prior Publication Data

US 2010/0260215 A1 Oct. 14, 2010

(51) Int. Cl.
*H01S 3/097* (2006.01)
(52) U.S. Cl. ............ 372/87; 372/22; 372/34; 372/50.11
(58) Field of Classification Search .................. 372/22, 372/34, 50.11, 87
See application file for complete search history.

(56) References Cited

U.S. PATENT DOCUMENTS

| | | | | |
|---|---|---|---|---|
| 5,581,572 A * | 12/1996 | Delorme et al. | ........... | 372/50.11 |
| 5,838,714 A * | 11/1998 | Delorme | ........... | 372/96 |
| 6,108,469 A | 8/2000 | Chen | | |
| 6,510,167 B1 * | 1/2003 | Jain et al. | ........... | 372/6 |
| 2005/0249509 A1 | 11/2005 | Nagarajan et al. | | |
| 2005/0254531 A1* | 11/2005 | Furukawa et al. | ........... | 372/22 |
| 2006/0039420 A1* | 2/2006 | Borley et al. | ........... | 372/20 |
| 2008/0089370 A1 | 4/2008 | Bhatia et al. | ........... | 372/32 |
| 2008/0089373 A1 | 4/2008 | Bhatia et al. | ........... | 372/38.02 |
| 2009/0086775 A1* | 4/2009 | Hu et al. | ........... | 372/21 |

* cited by examiner

*Primary Examiner* — Yuanda Zhang
(74) *Attorney, Agent, or Firm* — Kwadjo Adusei-Poku

(57) ABSTRACT

A method is provided for controlling a DBR laser diode wherein front and rear DBR section heating elements are controlled such that the reflectivity of the rear grating portion of the DBR section is lower than the reflectivity of the front grating portion of the DBR section. In this manner, lasing mode selection is dominated by the front grating portion and the front DBR section heating element can be controlled for wavelength tuning. In addition, the rear DBR section heating element can be controlled to narrow the spectral bandwidth of the DBR reflection spectra. Additional embodiments are disclosed and claimed.

9 Claims, 2 Drawing Sheets

SPLIT CONTROL OF FRONT AND REAR DBR GRATING PORTIONS

BACKGROUND

The present disclosure relates to Distributed Bragg Reflector (DBR) lasers and frequency-converted laser sources incorporating DBR lasers. More particularly, the present disclosure relates to novel designs and operational methods for improving wavelength control in DBR lasers and for maintaining stable and maximized output power of frequency-converted laser sources.

BRIEF SUMMARY

Although the various concepts of the present disclosure are not limited to lasers that operate in any particular part of the optical spectrum, reference is frequently made herein to frequency doubled green lasers, where wavelength fluctuations of the laser diode IR source typically generate fluctuations of the frequency-converted green output power. Such green-power fluctuations are often attributable to variations in the wavelength of the laser diode and the relatively narrow spectral acceptance curve of the wavelength conversion device used in the frequency-converted laser—typically a periodically poled MgO-doped lithium niobate (PPMgLN) SHG crystal or some other type of wavelength conversion device. If the aforementioned frequency-converted laser is used in a scanning projector, for example, these green-power fluctuations can generate unacceptable image artifacts.

It can be challenging to keep the emission wavelength of a DBR laser diode constant during operation. For example, changes in the thermal condition along the distinct sections of the laser diode usually result in variations of the emission wavelength of the laser diode. These wavelength variations typically arise as large mode hops in the emission spectra of the laser, multiple-mode emission spectra, or both. According to the subject matter of the present disclosure, DBR laser configurations and corresponding methods of operation are provided to help eliminate multiple-mode spectra and mitigate mode hopping, while increasing yield in laser module fabrication processes.

In accordance with one embodiment of the present disclosure, a method is provided for controlling, among other things, the wavelength of a DBR laser diode. According to the method, front and rear DBR section heating elements are controlled independently. More specifically, because the contribution of the front grating portion to the reflectivity of the DBR section at the range of available potential lasing modes exceeds the contribution of the rear grating portion to the reflectivity of the DBR section at the range of available potential lasing modes, the DBR laser diode can be controlled such that lasing mode selection is dominated by the front grating portion and the front DBR section heating element is used for wavelength tuning. In addition, the rear DBR section heating element can be controlled to narrow the spectral bandwidth of the DBR reflection spectra, eliminate multiple-mode laser emission spectra, and reduce the wavelength variation amplitude. Additional embodiments of the present disclosure relate to systems and methods of controlling frequency-converted laser sources comprising DBR laser diodes.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

DETAILED DESCRIPTION

Figure 1:
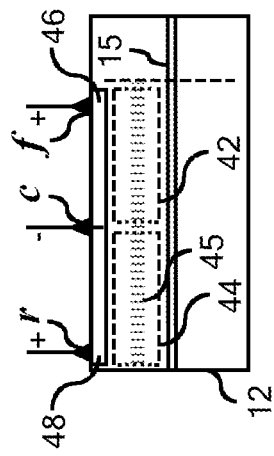
FIG. 1 is a top-view schematic illustration of a DBR laser diode incorporating front and rear DBR section heating elements.
Figure 2:
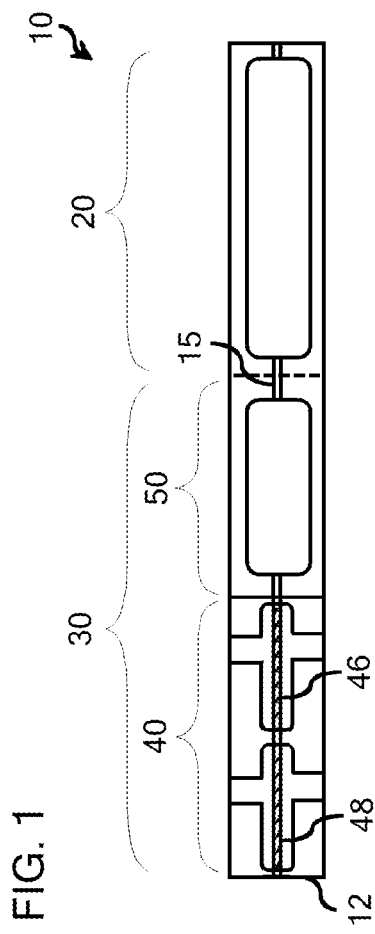
FIGS. 2 and 3 are side-view schematic illustrations of the DBR section of a DBR laser diode, including independently controlled front and rear DBR section heating elements.

Referring initially to FIGS. 1 and 2, a method of controlling a DBR laser diode 10 can be described by referring to the active and passive regions 20, 30 of the laser diode 10. Generally, the active and passive regions 20, 30 of the laser diode 10 are aligned along the optical axis of the laser diode 10, which runs the length of the waveguide 15 of the laser diode 10. The active region 20 comprises an optical gain medium. The passive region 30 comprises a DBR section 40 and an optional phase control section 50. The DBR section 40 comprises a Bragg grating 45 that is tailored to select a laser emission wavelength from a range of available potential lasing modes in the laser diode 10. The whole waveguide portion of the passive region 30 is tailored to be optically passive at the selected emission wavelength. The Bragg grating 45 generally extends along the waveguide portion of the passive region 30 and comprises a front grating portion 42 that is closer to the active region 20 of the laser diode and a rear grating portion 44 that is closer to the rear facet 12 of the laser diode 10. The DBR section 40 and Bragg grating 45 are merely illustrated schematically in FIGS. 1 and 2 because they are well known components of two-section and three-section DBR laser diodes.

Figure 3:
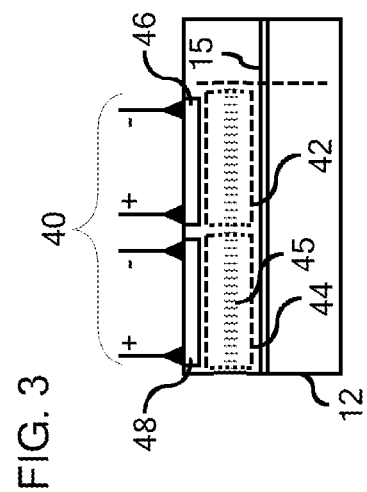

The DBR section 40 comprises front and rear heating elements 46, 48 that are arranged along distinct waveguide portions of the DBR section 40. As is illustrated schematically in FIG. 2, the front and rear heating elements 46, 48 form portions of a single continuous electrically resistive heating element delineated by distinct heating element control nodes, i.e., a front control node f, a rear control node r, and a common control node C positioned along the single continuous heating element between front and rear control nodes f, r. As can clearly be seen from FIG. 2, the structure of the single continuous electrically resistive heating element is such that electrical current may flow between the three control nodes across the front and rear heating elements without disruption of electrical continuity along the single heating element. Alternatively, as is illustrated in FIG. 3, the front and rear heating elements 46, 48 may form distinct electrically resistive heating elements each comprising at least two distinct heating element control nodes. In either case, the front heating element 46 is thermally coupled to the front grating portion 42 of the DBR section 40 and the rear heating element 48 is thermally coupled to the rear grating portion 44 of the DBR section 40.

Because the front grating portion 42 of the DBR section 40 is closer to the active region 20 of the laser diode than is the rear grating portion 44 of the DBR section 40, the contribution of the front grating portion 42 to the reflectivity of the DBR section 40 at the range of available potential lasing modes exceeds the contribution of the rear grating portion 44 to the reflectivity of the DBR section 40. Accordingly, lasing mode selection in the laser diode 10 is dominated by the front grating portion 42 and the front heating element 46 can be controlled independently of the rear heating element 48 to tune the selected emission wavelength. In particular embodiments of the present disclosure, the front and rear heating elements 46, 48 can be controlled to establish a thermal gradient along the waveguide portion in the DBR section 40 to reduce refractive index non-uniformities in the DBR section 40. In addition, the rear heating element 48 can be controlled independently of the front heating element 46 to narrow the spectral bandwidth of the DBR section 40, making it possible to eliminate multiple mode laser emission spectra and reduce mode jump amplitude in the emission spectra to as few as one or two lasing modes.

Figure 5:
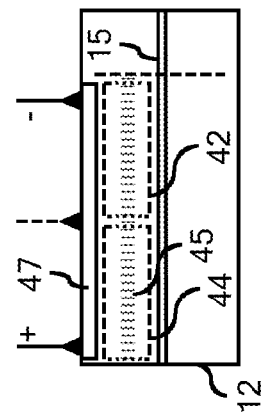
FIG. 5 is a side-view schematic illustration of the DBR section of a DBR laser diode, including front and rear DBR section heating elements controlled in series.
Figure 4:
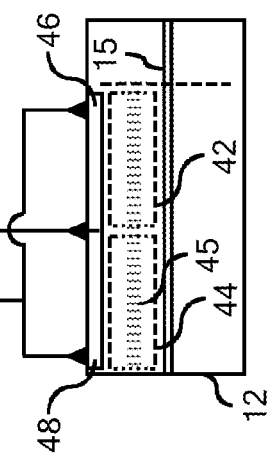
FIG. 4 is a side-view schematic illustration of the DBR section of a DBR laser diode, including front and rear DBR section heating elements controlled in parallel.

The present inventors have recognized that many optical package control frameworks are restricted to relatively low operating voltages, particularly in the context of providing suitably low operating voltages to the heating elements of a DBR laser. Accordingly, referring to the alternative embodiment illustrated in FIG. 4, where the DBR section 40 includes front and rear DBR section heating elements 46, 48 electrically connected in parallel, it is contemplated that the front and rear heating elements 46, 48 can be controlled in parallel to reduce heating element voltage in the laser diode, as compared to cases where the front and rear heating elements are controlled in series (see FIG. 5).

Preferably, the contribution of the front grating portion 42 to the reflectivity of the DBR section 40 will exceed the contribution of the rear grating portion 44 to the reflectivity of the DBR section 40. In particular embodiments the contribution of the front grating portion 42 to the reflectivity of the DBR section 40 will exceed the contribution of the rear grating portion 44 to the reflectivity of the DBR section 40 by between approximately 3 dB and approximately 8 dB.

In the illustrated embodiments, the front and rear heating elements 46, 48 comprise a common metallic thin film heater or distinct metallic thin film heaters integrated in the DBR section 40 but alternative configurations are contemplated, as long as the front and rear heating elements 46, 48 enable independent control of the temperature of the front and rear grating portions, 42, 44. For example, it is contemplated that the front and rear heating elements 46, 48 may be configured to heat the front and rear grating portions 42, 44 through current injection. In any case, the front DBR section heating element 46 can be controlled with a front heating element control voltage and the rear DBR section heating element 48 can be controlled with a rear heating element control voltage. It is also contemplated that the DBR section 40 may comprise additional heating elements arranged along additional distinct waveguide portions of the DBR section 40.

The DBR laser diode 10 may comprise a two-section DBR laser diode or three-section DBR laser diode including the phase control section 50. In the event the DBR laser diode 10 comprises a phase control section 50, the Bragg grating 45, the gain medium of the active region 20, and the front and rear heating elements 46, 48 should each be positioned outside of the phase control section 50.

Figure 6:
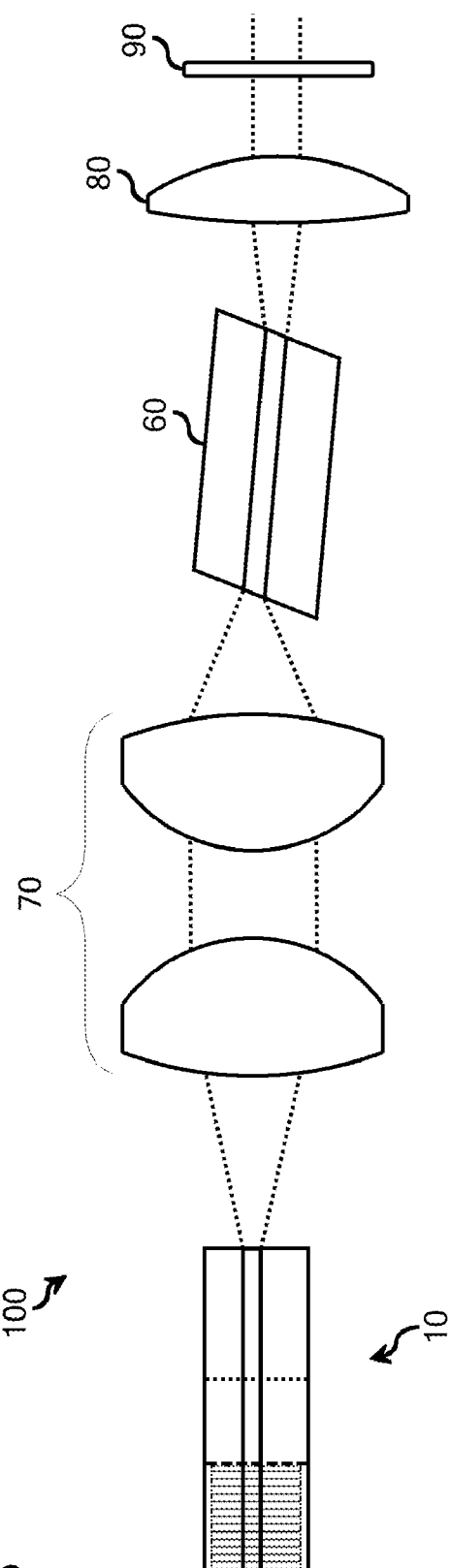
FIG. 6 is a generalized schematic illustration of a frequency-converted laser source incorporating a DBR laser diode.

FIG. 6 is a schematic illustration of a frequency-converted laser source 100 comprising a DBR laser diode 10, a wavelength conversion device 60, coupling optics 70, collimating optics 80, and an output color filter 90. In the illustrated embodiment, the DBR laser output light, e.g., IR light, can be coupled to the wavelength conversion device 60, e.g., a PPMgLN waveguide of an SHG crystal, using the coupling optics 70, e.g., two aspheric lenses. Green light generated in the SHG crystal and residual IR pump light can be collimated by the collimating optics 80 and the residual IR light can be eliminated by the color filter 90.

Although the present disclosure illustrates frequency-converted laser configurations that utilize an edge emitting three-section DBR laser including gain, phase, and DBR sections, it is noted that the concepts of the present disclosure are applicable to a variety of frequency-converted laser configurations including edge emitting lasers, vertical cavity surface emitting lasers, and DBR laser configurations that may or may not include a phase section. In addition, it is contemplated that a variety of wavelength conversion devices may be provided, including those configured for conversion beyond second harmonic generation (SHG). The concepts of the present disclosure are also applicable to a variety of applications in addition to laser scanning projectors.

Characterization results for front and rear heating elements in a DBR laser similar to that shown in FIGS. 1 and 2 illustrate that wavelength tuning can be dominated by the front heating elements, which are deemed to be at least capable of providing a wavelength tuning efficiency of up to 15.5 nm/W at 25° C., up to 16.8 nm/W at 60° C., with higher efficiencies contemplated. Tuning ranges of at least 6.9 nm and 7.3 nm at 25° C. and 60° C., respectively, are also contemplated for a heater voltage of 4.7 V. Although the thermal and electrical characteristics of the back heating element are typically similar to that of the front heating element, the lasing mode selection is dominated by the front grating portion. Reflection and transmission spectra measured below threshold indicate that, when the rear heating element is in operation, the reflection of the rear grating portion is lower than that of the front grating portion by 3-8 dB, with increasing tuning range from approximately 1 nm to approximately 6 nm. When the front heating element is in operation, the lasing mode is selected by the tuned front grating portion, as long as its reflection is higher than that of the rear grating portion.

When using the front heating element for wavelength tuning, output power measurements and laser characterization indicate that wavelength tuning efficiency can be doubled, power consumption can be reduced by at least 40%, and required current and voltage levels can be significantly reduced. In addition, it is contemplated that the output of a DBR laser diode utilizing independent control of the front and rear heating elements will exhibit a narrower DBR 3 dB reflection bandwidth and fewer longitudinal modes within the 3 dB bandwidth.

Characterization results of DBR lasers utilizing front and rear DBR section heating elements in the manner described herein show that mode-jump patterns can be controlled primarily with the rear heating elements while wavelength tuning range can be controlled by the front heating elements. Side lobes in DBR reflection spectra can be eliminated. The rear heating element can be controlled to eliminate multiple-mode emission spectra and provide single-mode emission spectra over a wide range of gain currents. Typical side mode suppression on the order of 40 dB and above is contemplated, also over a wide range of gain currents. The rear heating element can also be used to reduce mode-jump magnitude at a variety of wavelength tuning ranges under both CW and wavelength recovery operations, such as those described in U.S. Pub. Nos. US 2008/0089373 and US 2008/0089370. In laser production and selection, these types of spectral improvements can be used to convert the status of particular lasers from "rejected" to "acceptable."

It is contemplated that the aforementioned spectral improvements may be attributable to the thermal gradient that is created along the DBR section using the front and rear DBR section heating elements. The thermal gradient can be used to reduce non-uniformities along the optical path in the DBR section, i.e., non-uniformities in refractive index, temperature, grating pitch, grating duty cycle, grating form, DBR-section loss, reflection, etc. Refractive-index non-uniformity caused by submounting-induced stress has been demonstrated to be a major origin of spectral imperfections. The spectral improvements described above may also be attributable to shifts created in the reflection band of the rear grating portion to longer wavelengths, which provide better overlap with the reflection band of the front grating portion.

It is noted that recitations herein of a component of the present disclosure being "configured" in a particular way, to embody a particular property, or to function in a particular manner, are structural recitations, as opposed to recitations of intended use. More specifically, the references herein to the manner in which a component is "configured" denotes an existing physical condition of the component and, as such, is to be taken as a definite recitation of the structural characteristics of the component.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present invention it is noted that the term "approximately" is utilized herein to represent the inherent degree of uncertainty that may be attributed to any quantitative comparison, value, measurement, or other representation. The term "approximately" is also utilized herein to represent the degree by which a quantitative representation may vary from a stated reference without resulting in a change in the basic function of the subject matter at issue.

Having described the subject matter of the present disclosure in detail and by reference to specific embodiments thereof, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

The invention claimed is:

1. A method of controlling a DBR laser diode comprising an active region and a passive region aligned along an optical axis of the laser diode, wherein:
   the active region of the laser diode comprises an optical gain medium;
   the passive region of the laser diode comprises a DBR section;
   the DBR section comprises a Bragg grating tailored to contribute to selection of a laser emission wavelength from a range of available potential lasing modes;
   a waveguide portion of the passive region is tailored to be optically passive at the selected emission wavelength;
   the Bragg grating extends along the DBR section and comprises front and rear grating portions;
   the front grating portion of the DBR section is closer to the active region of the laser diode than is the rear grating portion of the DBR section, such that the contribution of the front grating portion to the reflectivity of the DBR section at the range of available potential lasing modes exceeds the contribution of the rear grating portion to the reflectivity of the DBR section at the range of available potential lasing modes and lasing mode selection in the laser diode is dominated by the front grating portion;
   the DBR section comprises a front heating element thermally coupled to the front grating portion of the DBR section and a rear heating element thermally coupled to the rear grating portion of the DBR section;
   the front and rear heating elements comprise portions of a single continuous electrically resistive heating element delineated by distinct heating element control nodes comprising a front control node, a rear control node, and a common control node positioned along the single heating element between the front and rear control nodes;
   the front and rear heating elements of the DBR section are arranged along distinct waveguide portions of the DBR section;
   the structure of the single continuous electrically resistive heating element is such that electrical current may flow between the three control nodes across the front and rear heating elements without disruption of electrical continuity along the single heating element to establish a thermal gradient along the waveguide portions in the DBR section to reduce refractive index non-uniformities along the waveguide portions in the DBR section; and
   the front heating element is controlled independently of the rear heating element to tune the selected emission wavelength and narrow the spectral bandwidth of the reflection spectra of the DBR section.

2. A method as claimed in claim 1 wherein the rear heating element is further controlled to eliminate multiple mode laser emission spectra and reduce mode jump amplitude in the emission spectra to no more than two modes.

3. The method as claimed in claim 1 wherein the DBR laser diode comprises a two-section DBR laser diode comprising the DBR section and the gain section.

4. The method as claimed in claim 1 wherein the DBR laser diode comprises a three-section DBR laser diode and the passive region of the three section DBR laser diode further comprises a phase control section interposed between the DBR section and the gain section.

5. The method as claimed in claim 1 wherein the contribution of the front grating portion to the reflectivity of the DBR section at the range of available potential lasing modes exceeds the contribution of the rear grating portion to the reflectivity of the DBR section at the range of available potential lasing modes by between approximately 3 dB and approximately 8 dB.

6. A method as claimed in claim 1 wherein the front and rear heating elements comprise metallic thin film heaters integrated in the DBR section.

7. The method as claimed in claim 1 wherein the Bragg grating comprises one or more additional grating portions between the front and rear grating portions and the DBR section comprises additional heating elements arranged along the additional grating portions.

8. The method as claimed in claim 1 wherein: the DBR laser diode forms part of a frequency converted laser source comprising a wavelength conversion device optically coupled to an output of the DBR laser diode; and the wavelength conversion device is configured to convert the selected emission wavelength to a converted wavelength in the green portion of the optical spectrum.

9. A laser source comprising a DBR laser diode, wherein:
the laser diode comprises an active region and a passive region aligned along an optical axis of the laser diode;
the active region of the laser diode comprises an optical gain medium;
the passive region of the laser diode comprises a DBR section;
the DBR section comprises a Bragg grating tailored to contribute to selection of a laser emission wavelength from a range of available potential lasing modes;
a waveguide portion of the passive region is tailored to be optically passive at the selected emission wavelength;
the Bragg grating extends along the DBR section and comprises front and rear grating portions;
the front grating portion of the DBR section is closer to the active region of the laser diode than is the rear grating portion of the DBR section, such that the contribution of the front grating portion to the reflectivity of the DBR section at the range of available potential lasing modes exceeds the contribution of the rear grating portion to the reflectivity of the DBR section at the range of available potential lasing modes and lasing mode selection in the laser diode is dominated by the front grating portion;
the DBR section comprises a front heating element thermally coupled to the front grating portion of the DBR section and a rear heating element thermally coupled to the rear grating portion of the DBR section;
the front and rear heating elements comprise portions of a single continuous electrically resistive heating element delineated by distinct heating element control nodes comprising a front control node, a rear control node, and a common control node positioned along the single heating element between the front and rear control nodes;
the front and rear heating elements of the DBR section are arranged along distinct waveguide portions of the DBR section;
the structure of the single continuous electrically resistive heating element is such that electrical current may flow between the three control nodes across the front and rear heating elements without disruption of electrical continuity along the single heating element to establish a thermal gradient along the waveguide portions in the DBR section to reduce refractive index non-uniformities along the waveguide portions in the DBR section; and
the laser source is programmed to control the front heating element independently of the rear heating element to tune the selected emission wavelength and to narrow the spectral bandwidth of the reflection spectra of the DBR section.

* * * * *